(12) United States Patent
Yang et al.

(10) Patent No.: US 11,094,814 B2
(45) Date of Patent: Aug. 17, 2021

(54) SEMICONDUCTOR POWER DEVICE

(71) Applicant: EPISTAR CORPORATION, Hsinchu (TW)

(72) Inventors: Ya-Yu Yang, Hsinchu (TW); Shang-Ju Tu, Hsinchu (TW); Tsung-Cheng Chang, Hsinchu (TW); Chia-Cheng Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 41 days.

(21) Appl. No.: 15/720,564

(22) Filed: Sep. 29, 2017

(65) Prior Publication Data

US 2019/0103482 A1 Apr. 4, 2019

(51) Int. Cl.
*H01L 29/78* (2006.01)
*H01L 29/778* (2006.01)
*B82Y 99/00* (2011.01)
*H01L 29/20* (2006.01)
*H01L 21/02* (2006.01)
*H01L 29/207* (2006.01)

(52) U.S. Cl.
CPC .......... *H01L 29/78* (2013.01); *H01L 29/7783* (2013.01); *B82Y 99/00* (2013.01); *H01L 21/0254* (2013.01); *H01L 21/02458* (2013.01); *H01L 21/02505* (2013.01); *H01L 29/2003* (2013.01); *H01L 29/207* (2013.01)

(58) Field of Classification Search
CPC .................................................. H01L 29/7783
See application file for complete search history.

(56) References Cited

U.S. PATENT DOCUMENTS

| 7,112,830 | B2* | 9/2006 | Munns | H01L 29/155 257/12 |
| 9,035,354 | B2 | 5/2015 | Saxler et al. | |
| 9,773,896 | B2* | 9/2017 | Lutgen | H01L 29/7783 |
| 2008/0258135 | A1* | 10/2008 | Hoke | H01L 29/201 257/23 |
| 2010/0102359 | A1* | 4/2010 | Khan | H01L 21/02057 257/194 |

(Continued)

OTHER PUBLICATIONS

Hsiao et al., "Investigation of the low-temperature AlGaN interlayer in AlGaN/GaN/AlGaN double heterostructure on Si substrate", Applied Physics Express, vol. 7, No. 11, Published Oct. 9, 2014 retrieved from http://iopscience.iop.org/article/10.7567/APEX.7.115501 4 pages.

*Primary Examiner* — Abul Kalam
(74) *Attorney, Agent, or Firm* — Ditthavong, Steiner & Mlotkowski (57) ABSTRACT

A semiconductor power device includes a substrate, a buffer structure formed on the substrate, a barrier structure formed on the buffer structure, a channel layer formed on the barrier structure, and a barrier layer formed on the channel layer. The barrier structure includes a first functional layer on the buffer structure, a first back-barrier layer on the first functional layer, and an interlayer between the first back-barrier layer and the first functional layer. A material of the first back-barrier layer comprises $Al_{x1}Ga_{1-x1}N$, a material of the first functional layer comprises $Al_{x2}Ga_{1-x2}N$, $0<x1\leq1$, $0\leq x2\leq1$, and $x1\neq x2$. The interlayer includes a carbon doped or an iron doped material.

19 Claims, 8 Drawing Sheets

(56) References Cited

U.S. PATENT DOCUMENTS

| | | | |
|---|---|---|---|
| 2011/0297961 A1* | 12/2011 | Bunin | H01L 29/42316 257/76 |
| 2014/0326951 A1* | 11/2014 | Bunin | H01L 29/42316 257/20 |
| 2015/0021660 A1* | 1/2015 | Chen | H01L 29/66462 257/190 |
| 2015/0115327 A1* | 4/2015 | Briere | H01L 29/778 257/194 |
| 2015/0357454 A1* | 12/2015 | Lutgen | H01L 29/7783 257/76 |
| 2017/0125562 A1* | 5/2017 | Prechtl | H01L 29/1029 |
| 2017/0250273 A1* | 8/2017 | Schultz | H01L 29/7783 |
| 2017/0271454 A1* | 9/2017 | Prechtl | H01L 21/0254 |
| 2018/0138304 A1* | 5/2018 | Curatola | H01L 29/7784 |

\* cited by examiner

SEMICONDUCTOR POWER DEVICE

FIELD OF THE INVENTION

The present disclosure is related to a semiconductor device, and more particularly, to a semiconductor power device.

DESCRIPTION OF BACKGROUND ART

In recent years, with the growing demand for high frequency or high power products, a semiconductor device made of gallium nitride (GaN) materials and having a stack of AlGaN/GaN is widely used in power supplies, DC/DC converters, DC/AC inverters, uninterruptible power supplies, vehicles, motors, and wind powers due to its characteristics of high electron mobility and being able to operate at high frequency, high power, and high temperature.

SUMMARY OF THE INVENTION

A semiconductor power device includes a substrate, a buffer structure formed on the substrate, a barrier structure formed on the buffer structure, a channel layer formed on the barrier structure, and a barrier layer formed on the channel layer. The barrier structure includes a first functional layer on the buffer structure, a first back-barrier layer on the first functional layer, and an interlayer between the first back-barrier layer and the first functional layer. A material of the first back-barrier layer comprises $Al_{x1}Ga_{1-x1}N$, a material of the first functional layer comprises $Al_{x2}Ga_{1-x2}N$, $0<x1\leq1$, $0\leq x2\leq1$, and $x1\neq x2$. The interlayer includes a carbon (C) doped or an iron (Fe) doped material.

DETAILED DESCRIPTION OF THE PREFERRED EMBODIMENTS

The present disclosure will now be described more specifically with reference to the following embodiments. It is to be noted that the following descriptions of the embodiments of this disclosure are presented herein for purpose of illustration and description only. It is not intended to be exhaustive or to be limited to the precise form disclosed.

Figure 1:
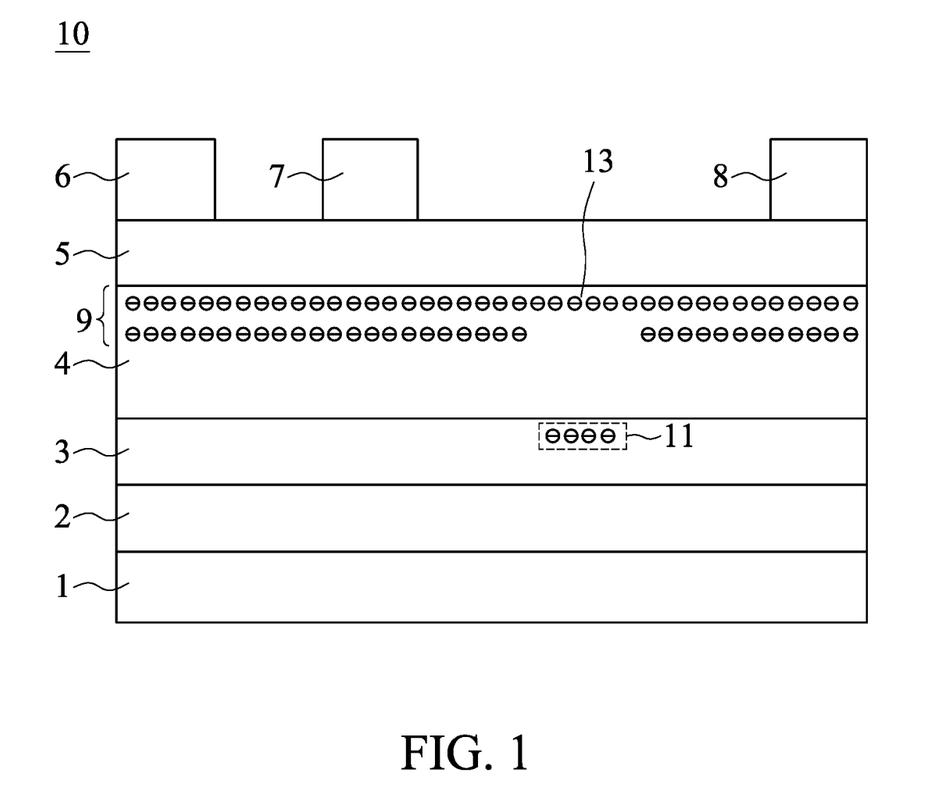
FIG. 1 shows a cross sectional view of a semiconductor power device 10.

FIG. 1 shows a semiconductor power device 10. The semiconductor power device 10 is a depletion mode (D-mode) power device. The semiconductor power device 10 includes a substrate 1, a nucleation structure 2 formed on the substrate 1, a buffer structure 3 formed on the nucleation structure 2, a channel layer 4 formed on the buffer structure 3, and a barrier layer 5 formed on the channel layer 4. The semiconductor power device 10 further includes a source electrode 6, a gate electrode 7 and a drain electrode 8 formed on the barrier layer 5. A two-dimensional electron gas (2DEG) 9 is produced in the channel layer 4 near an interface of the channel layer 4 and the barrier layer 5 by spontaneous polarization and piezoelectric polarization of the channel layer 4 and the barrier layer 5.

In the D-mode power device 10, when a gate voltage ($V_g$) is a negative voltage and is applied to the gate electrode 7, the 2DEG 9 will be depleted due to the band gap of the channel layer 4 and the barrier layer 5 being raised above the fermi level. When the gate voltage is smaller than a threshold voltage ($V_{th}$) of the semiconductor power device 10, the 2DEG 9 under the gate electrode 7 is completely depleted which is an off state. In one embodiment, the semiconductor power device 10 includes multiple defects, such as a defect region 11 in the buffer structure 3. When the semiconductor power device 10 is operated in a switching operation (on-off state), some electrons in 2DEG 9 will drift toward other layers and even be trapped in the defect region 11 in the off state as shown in FIG. 1.

The electrons trapped in the defect region 11 will cause a low concentration of the 2DEG 9, corresponding to and above the defect region 11 shown as a portion 13 in FIG. 1, due to the electron exclusion between the electrons in the defects region 11 and the 2DEG 9. In that way, the electrons trapped in defects will increase a turn-on resistance and a threshold voltage of the semiconductor power device 10, and reduce a drain-to-source current ($I_{ds}$) in the following switching operation. This phenomenon called current collapse and the efficiency of the semiconductor power device 10 will be reduced accordingly.

One method to evaluate the effect of current collapse is comparing a turn-on resistance $R_{ON1}$ before a semiconductor power device operated under an off-state stressing condition and a turn-on resistance $R_{ON2}$ after the semiconductor power device operated under the off-state stressing condition. A ratio $R_{ON2}/R_{ON1}$ can be obtained to evaluate an effect of current collapse of the semiconductor power device PD. If the ratio $R_{ON2}/R_{ON1}$ is closer to one, the effect of current collapse is absent or unobvious, and the performance of the semiconductor power device PD can be kept without decay. If the ratio $R_{ON2}/R_{ON1}$ is larger than one, we can conclude that the effect of current collapse exists in the semiconductor power device PD.

Figure 2A:
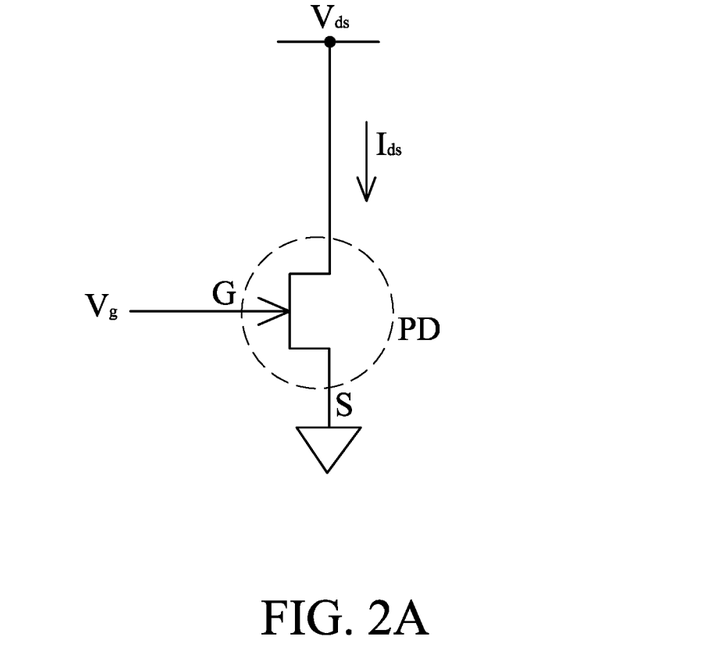
FIG. 2A shows a circuit used to measure a turn-on resistance of a semiconductor power device.
Figure 2B:
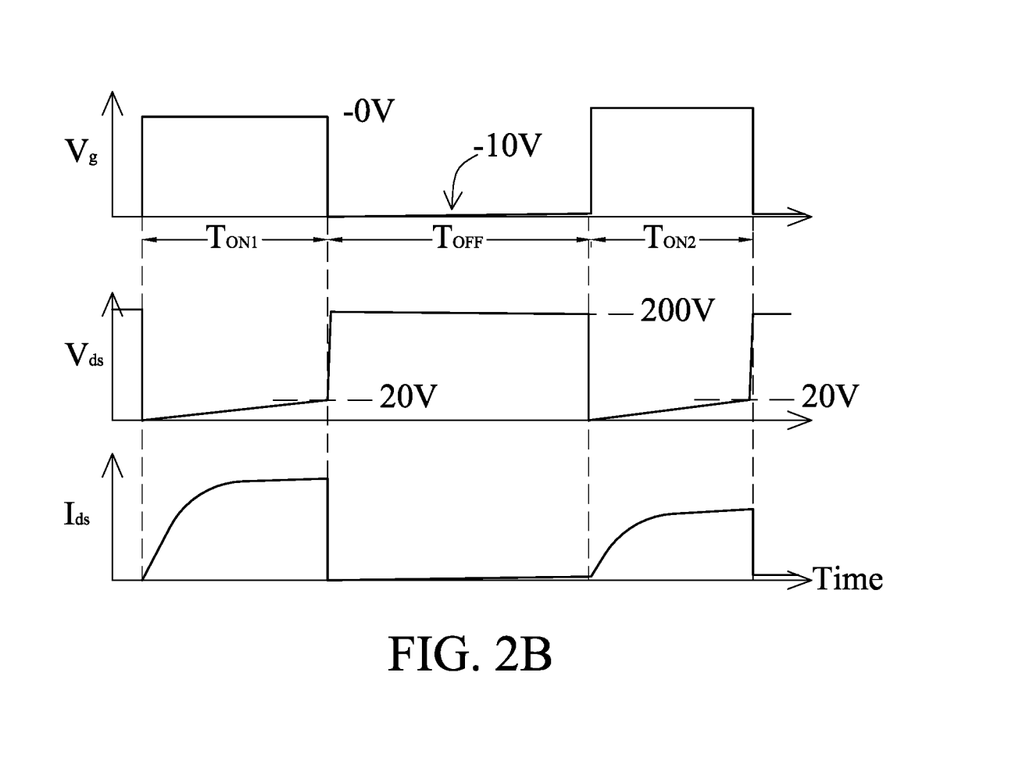
FIG. 2B shows the waveform signals of a drain-to-source voltage ($V_{ds}$), a gate voltage ($V_g$), and a drain-to-source current ($I_{ds}$) during on-off operation

In one embodiment, FIG. 2A shows a circuit used to measure the turn-on resistance of a semiconductor power device PD with a source electrode S, a drain electrode D, and a gate electrode G. A drain-to-source voltage ($V_{ds}$) is provided between the drain electrode and outputted from the source electrode. A gate electrode ($V_g$) is selected to turn on or to turn off the semiconductor power device PD during on-off operation. A drain-to-source current ($I_{ds}$) of the semiconductor power device PD is measured accordingly during the on-off operation. FIG. 2B shows waveform signals of the provided drain-to-source voltage $V_{ds}$, the provided gate voltage $V_g$, and the measured drain-to-source current $I_{ds}$ of the semiconductor power device PD during on-off operation, which is the semiconductor power device PD is turned on in a period $T_{ON1}$, turned off in a period $T_{OFF}$, and turned on again in a period $T_{ON2}$ complying with the variation of $V_g$.

In one embodiment, the periods $T_{ON1}$, $T_{OFF}$, and $T_{ON2}$ are 60 ms, 10 s, and 60 ms, respectively. In the period $T_{ON1}$, the $V_g$ is kept at 0V, and the $V_{ds}$ is changed continuously from 0V to 20V, and $I_{ds}$ is measured correspondingly. The variation of $I_{ds}$ corresponding to the changed $V_{ds}$ in the period $T_{ON1}$ can be represented in an $I_{ds}$-$V_{ds}$ characteristics diagram (not shown) which includes a linear $I_{ds}$-$V_{ds}$ segment. In the $I_{ds}$-$V_{ds}$ characteristics diagram, a turn-on resistance $R_{ON1}$ before the semiconductor power device PD operated under an off-state stressing condition can be obtained by calculating the reciprocal of the slope of the linear $I_{ds}$-$V_{ds}$ segment. In the period $T_{OFF}$, the $V_g$ is kept at −10V, the $V_{ds}$ is kept at 200V, the semiconductor power device PD is turned off, and therefore the $I_{ds}$ is around 0 A. In other words, the semiconductor power device PD is continuously stressed under the $V_{ds}$ at 200V in the period $T_{OFF}$. Then, the semiconductor power device PD is turned on again with the same operating condition during the period $T_{ON2}$, and the variation of $I_{ds}$ corresponding to the changed $V_{ds}$ in the period $T_{ON2}$ can be represented in a $I_{ds}$-$V_{ds}$ characteristics diagram (not shown) which includes a linear $I_{ds}$-$V_{ds}$ segment (not shown). In the $I_{ds}$-$V_{ds}$ characteristics diagram, a turn-on resistance $R_{ON2}$ after the semiconductor power device PD operated under an off-state stressing condition can be obtained by calculating the reciprocal of the slope of the linear $I_{ds}$-$V_{ds}$ segment. As mentioned previously, a ratio $R_{ON2}/R_{ON1}$ can be obtained to evaluate an effect of current collapse of the semiconductor power device PD. If the ratio $R_{ON2}/R_{ON1}$ is closer to one, the effect of current collapse is absent or unobvious, and the performance of the semiconductor power device PD can be kept without decay. If the ratio $R_{ON2}/R_{ON1}$ is larger than one, we can conclude that the effect of current collapse exists in the semiconductor power device PD.

Figure 3:
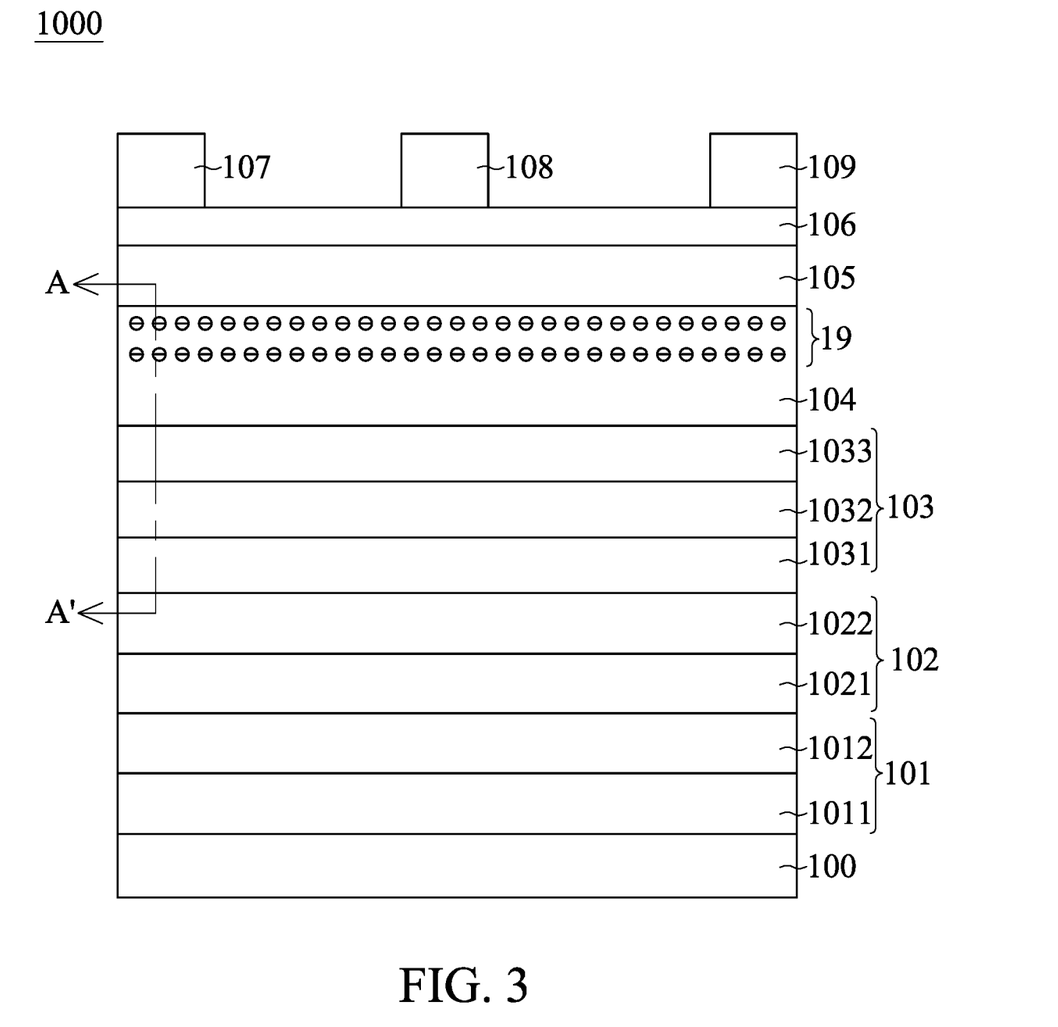
FIG. 3 shows a cross sectional view of a semiconductor power device 1000 in accordance with a first embodiment of the present disclosure.

FIG. 3 shows a cross sectional view of a semiconductor power device 1000 in accordance with a first embodiment of the present disclosure. As shown in FIG. 3, the semiconductor power device 1000 includes a substrate 100, a nucleation structure 101 formed on the substrate 100, a buffer structure 102 formed on the nucleation structure 101, a back-barrier structure 103 formed on the buffer structure 102, a channel layer 104 formed on the back-barrier structure 103, a barrier layer 105 formed on the channel layer 104, a cap layer 106 formed on the barrier layer 105, and a source electrode 107, a gate electrode 108, and a drain electrode 109 formed on the cap layer 106 respectively.

The location and the structure of the source electrode 107, the gate electrode 108, and the drain electrode 109 of the semiconductor power device 1000 can be adjusted according to different designs of the semiconductor power device 1000 such as a D-mode power device or an enhancement mode (E-mode) power device.

In one embodiment, the source electrode 107 and/or the drain electrode 109 can be formed directly on the cap layer 106, the barrier layer 105, the channel layer 104, the back-barrier structure 103, or the buffer structure 102.

In another embodiment of a recess E-mode power device (not shown), the gate electrode 108 can be formed in a recess (not shown) through the cap layer 106, and the barrier layer 105, and exposing a portion of the channel layer 104.

In another embodiment of a p-GaN E-mode power device (not shown), the gate electrode 108 can be formed on a p-GaN layer (not shown) which is formed above the cap layer 106 or the barrier layer 105.

In one embodiment, the nucleation structure 101 includes one or multiple layers. In the present embodiment, the nucleation structure 101 includes a low temperature (LT) nucleation layer 1011, and a high temperature (HT) nucleation layer 1012 formed on the LT nucleation layer 1011. In one embodiment, the nucleation structure 101 is a structure for reducing the growth stress of the following layers formed on the substrate.

In the present embodiment, the low temperature is about 950~1000° C., and the high temperature is about 1010~1500° C.

In one embodiment, the buffer structure 102 includes one or multiple layers. In the present embodiment, the buffer structure 102 includes a strain structure 1021 and a high resistance thick layer 1022 formed on the strain structure 1021.

In one embodiment, a method of forming the nucleation structure 101, the buffer structure 102, the back-barrier structure 103, the channel layer 104, the barrier layer 105, or the cap layer 106 includes physical vapor deposition (PVD), atomic layer deposition (ALD), metal-organic chemical vapor deposition (MOCVD), or molecular-beam epitaxy (MBE). In the present embodiment, the method of growing the LT nucleation layer 1011 and/or HT nucleation layer 1012 is MOCVD. In the present embodiment, the method of growing the nucleation structure 101, the buffer structure 102, the back-barrier structure 103, the channel layer 104, the barrier layer 105, and the cap layer 106 is MOCVD.

In one embodiment, the back-barrier structure 103 includes a functional layer 1031, a high resistance interlayer 1032 formed on the functional layer 1031, and a first back-barrier layer 1033 formed on the high resistance interlayer 1032. In the present embodiment, the functional layer 1031 includes a second back-barrier layer.

In one embodiment, a material of the substrate 100 includes conductive material or insulating material. The conductive material includes Si, SiC, GaN, or GaAs. The insulating material includes sapphire, or silicon on insulator (SOI). In the present embodiment, the substrate 100 includes Si.

In one embodiment, a material of the LT nucleation layer 1011 and the HT nucleation layer 1012 includes a semiconductor material such as AlN, AlGaN, GaN, InGaN, AlInGaN or the combination thereof. In the present embodiment, the material of the LT nucleation layer 1011 and HT nucleation layer 1012 both are AlN.

In one embodiment, the thickness of the LT nucleation layer 1011 is 10-100 nm. In the present embodiment, the thickness of the LT nucleation layer 1011 is 40 nm.

In one embodiment, the HT nucleation layer 1012 is 100 nm-200 nm. In the present embodiment, the HT nucleation layer 1012 is 150 nm.

In one embodiment, the strain structure 1021 of the buffer structure 102 includes a pair or pairs of two strain layers (not shown). The material of the two strain layers includes AlN/AlGaN or AlGaN/AlGaN. In one embodiment, each pair of the strain structure 1021 includes the same or different material with different doping conditions, such as a pair of undoped material and doped material. The undoped material/doped material can be undoped AlGaN/doped AlGaN, undoped AlN/doped AlN, undoped AlN/doped AlGaN, or undoped AlGaN/doped AlN. In the present embodiment, the undoped material/doped material is carbon-doped AlN/undoped AlGaN. In one embodiment, the strain structure 102 comprises a superlattice structure of $Al_mGa_{1-m}N$ and $Al_nGa_{1-n}N$, wherein $0 \leq m \leq 1$, $0 \leq n \leq 1$.

In one embodiment, the strain structure 1021 includes 50 to 100 pairs. In the present embodiment, the strain structure 1021 includes 80 pairs. In one embodiment, a thickness of each strain layer is 5 nm to 30 nm.

In one embodiment, the high resistance thick layer 1022 includes GaN or AlGaN doped with carbon (C) or iron (Fe). And a thickness of the high resistance thick layer 1022 is 1 μm to 5 μm. In the present embodiment, a thickness of the high resistance thick layer 1022 is more than or equal to 2 μm.

In one embodiment, a doping concentration of carbon (C) or iron (Fe) in the high resistance thick layer 1022 is at least $10^{18}$ cm$^{-3}$.

In one embodiment, the buffer structure 102 here refers to a structure sandwiched between two materials to accommodate difference in their crystallographic structures. In one embodiment, the high resistance thick layer 1022 is designed for blocking the leakage current passing through current leakage path in the buffer structure 102 or the substrate 100.

Figure 4:
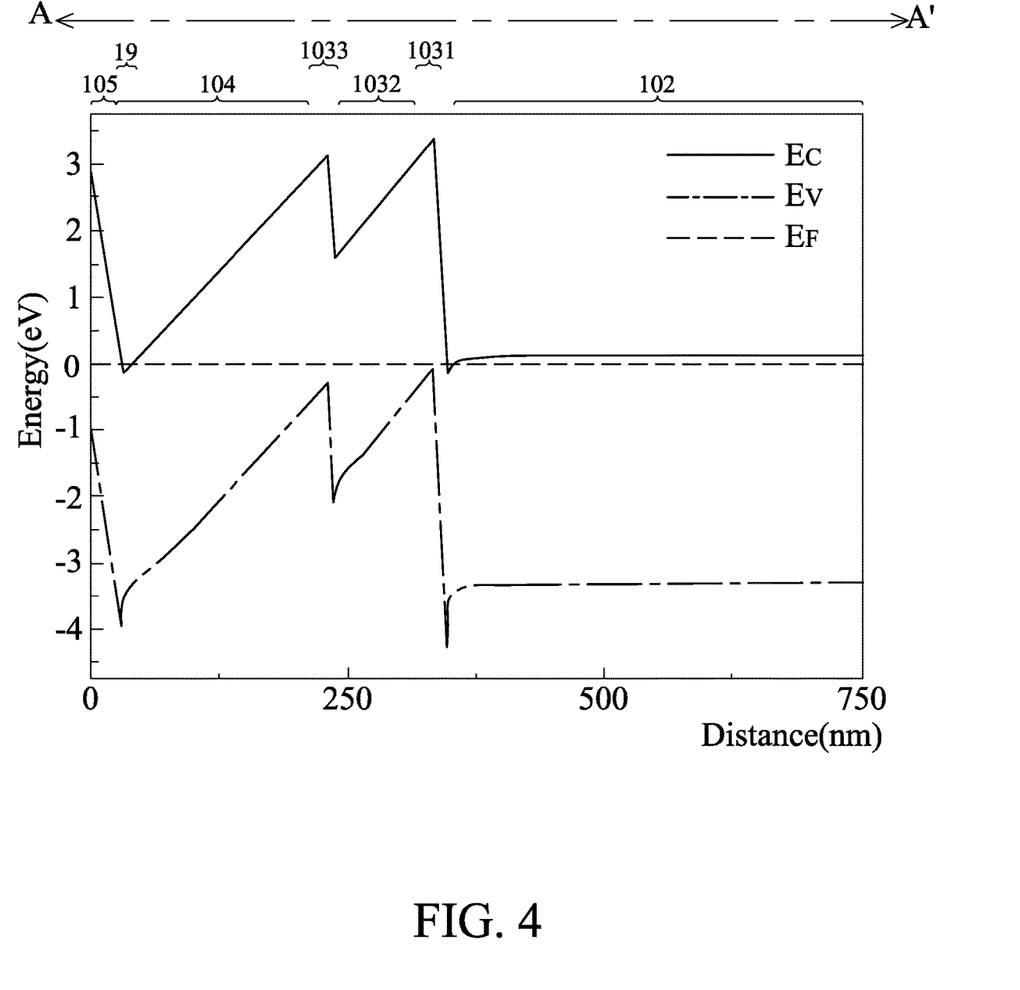
FIG. 4 shows an energy band diagram of the semiconductor power device 1000 in accordance with the first embodiment of the present disclosure.

FIG. 4 shows a simulative band gap diagram of the semiconductor power device 1000 which is taken along line A-A' of FIG. 3. In the label of FIG. 4 the horizontal axis refers to each layer of the semiconductor power device 1000 along line A-A' in FIG. 3, the vertical axis refers to the relative energy of the band gap diagram, $E_F$ refers to fermi-level, Ec refers to conduction band, and Ev refers to valence band. The 2DEG 19, a relatively low band gap shown in FIG. 4, is formed in the channel layer 104 near to the interface of the channel layer 104 and the barrier layer 105.

As shown in FIG. 4, an interface between the second back-barrier layer (functional layer) 1031 and the buffer structure 102 includes another relatively low band gap which is easily to trap electrons in the buffer structure 102. Therefore, the first back-barrier layer 1033 and the second back-barrier layer 1031 including relatively high band gaps can block the electron from passing through the second back-barrier layer 1031 and the first back-barrier layer 1033 and being trapped in the buffer structure 102. Furthermore, the high resistance interlayer 1032 formed between the first back-barrier layer 1033 and the second back-barrier layer 1031 can also block the electrons from being trapped in the buffer structure 102. The current collapse effect can be reduced via the back-barrier structure 103.

In one embodiment, a material of the second back-barrier layer 1031 includes $Al_{x1}Ga_{1-x1}N$, $0 \leq x1 \leq 1$. In the present embodiment, the Al composition ratio x1 is equal to or greater than 0.5. A thickness of the second back-barrier layer 1031 is 5 nm to 50 nm. In the present embodiment, a thickness of the second back-barrier layer 1031 is equal to or less than 20 nm. Therefore, the second back-barrier layer 1031, including a high band-gap and thin thickness layer inserted between the buffer structure 102 and the channel layer 104, is able to reduce the electron been pass through and trapped in the buffer structure 102 to reduce the effect of current collapse.

In one embodiment, a material of the first back-barrier layer 1033 includes $Al_{x2}Ga_{1-x2}N$, $0 \leq x2 \leq 1$. In the present embodiment, the Al composition ratio x2 is equal to or greater than 0.5. A thickness of the first back-barrier layer 1033 is 5 nm to 50 nm. In the present embodiment, a thickness of the first back-barrier layer 1033 is equal to or less than 20 nm and the first back-barrier layer 1033 is undoped. In the present embodiment, the Al composition ratio x1 is equal to or greater than the Al composition ratio x2. Therefore, the band-gap of the second back-barrier layer 1031 is equal to or higher than the first back-barrier layer 1033 in order to further reduce the effect of current collapse.

In the present embodiment, a material of the high resistance interlayer 1032 includes a material with dopant, such as C dopant or Fe dopant. The dopant is not limited to C or Fe. Any dopant or material that reaches a high resistance material of the high resistance interlayer 1032 can be chosen according to different design choices.

In one embodiment, a doping concentration of the C dopant or the Fe dopant in the high resistance interlayer 1032 is at least $10^{18}$ cm$^{-3}$ in order to achieve a high resistance. Due to the high resistance of the high resistance interlayer 1032, the electrons can be prevented from passing through it and the effect of current leakage can also be reduced.

In one embodiment, a thickness of the high resistance interlayer 1032 is less than or equal to 100 nm, and a material of the high resistance interlayer 1032 includes GaN, AlGaN, InGaN, or AlInGaN. In the present embodiment, the high resistance interlayer 1032 is a carbon-doped GaN. The thickness of the high resistance inter layer 1032 is 100 nm.

In one embodiment, a material of the channel layer 104 includes GaN, AlGaN, AlInGaN, InGaN or the combination thereof. A material of the barrier layer 105 includes GaN, AlGaN, AlInGaN, InGaN or the combination thereof. In the present embodiment, a material of the channel layer 104 includes GaN, and a material of the barrier layer 105 includes $Al_yGa_{1-y}N$, $0 < y \leq 1$. A thickness of the channel layer 104 is 100 nm to 500 nm, and a thickness of the barrier layer 105 is 10 nm to 50 nm. In the present embodiment, a thickness of the back barrier layer 105 is equal to or less than 20 nm.

In one embodiment, a material of the cap layer 106 is GaN, and a thickness of the cap layer 106 is 2 nm to 50 nm. In the present embodiment, a thickness of the cap layer 106 is less than or equal to 10 nm.

Figure 5:
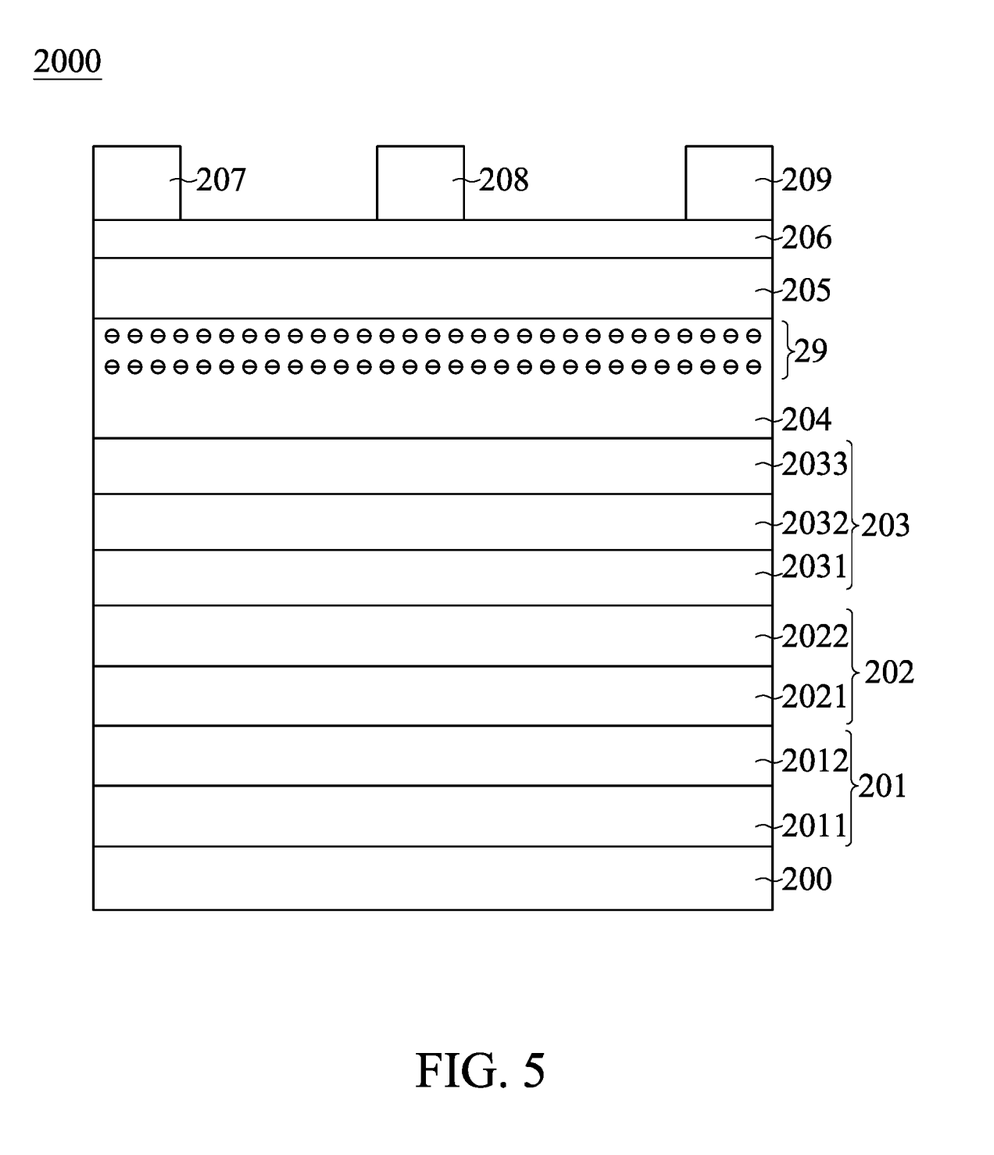
FIG. 5 shows a cross sectional view of a semiconductor power device 2000 in accordance with a second embodiment of the present disclosure.

FIG. 5 shows a cross sectional view of a semiconductor power device 2000 in accordance with a second embodiment of the present disclosure. As shown in FIG. 5, the semiconductor power device 2000 includes a substrate 200, a nucleation structure 201 formed on the substrate 200, a buffer structure 202 formed on the nucleation structure 201, a back-barrier structure 203 formed on the buffer structure 202, a channel layer 204 formed on the back-barrier structure 203, a barrier layer 205 formed on the channel layer 204, a cap layer 206 formed on the barrier layer 205, and a source electrode 207, a gate electrode 208, and a drain electrode 209 formed on the cap layer 206 respectively.

The location and the structure of the source electrode 207, the gate electrode 208, and the drain electrode 209 of the semiconductor power device 2000 can be adjusted according to different designs of the semiconductor power device 2000 such as a D-mode power device or an enhancement mode (E-mode) power device.

In one embodiment, the back-barrier structure 203 includes a functional layer 2031, a high resistance interlayer 2032 formed on the functional layer 2031, and a back-barrier layer 2033 formed on the high resistance interlayer 2032. In the present embodiment, the functional layer 2031 includes a space layer.

In one embodiment, a material of the substrate 200 includes conductive material or insulating material. The conductive material includes Si, SiC, GaN, or GaAs. The insulating material includes sapphire, or silicon on insulator (SOI). In the present embodiment, the substrate 200 includes Si.

In one embodiment, the nucleation structure 201 includes one or multiple layers. In the present embodiment, the nucleation structure 201 includes the LT nucleation layer 2011, and the HT nucleation layer 2012 formed on the LT nucleation layer 2011. In one embodiment, the nucleation structure 201 is a structure for reducing an epitaxy growth stress of the following layers formed on the substrate.

In the present embodiment, the low temperature is about 950~1000° C., and the high temperature is about 1010~1500° C.

In one embodiment, the buffer structure 202 includes one or multiple layers. In the present embodiment, the buffer structure 202 includes a strain structure 2021 and a high resistance thick layer 2022 formed on the strain structure 2021.

In one embodiment, a method of forming the nucleation structure 201, the buffer structure 202, the back-barrier structure 203, the channel layer 204, the barrier layer 205, or the cap layer 206 includes physical vapor deposition (PVD), atomic layer deposition (ALD), metal-organic chemical vapor deposition (MOCVD), or molecular-beam epitaxy (MBE). In the present embodiment, the method of growing the LT nucleation layer 2011 and/or the HT nucleation layer 2012 is MOCVD. In the present embodiment, the method of growing the nucleation structure 201, the buffer structure 202, the back-barrier structure 203, the channel layer 204, the barrier layer 205, and the cap layer 206 is MOCVD.

In one embodiment, a material of the LT nucleation layer 2011 and the HT nucleation layer 2012 includes semiconductor material such as AlN, AlGaN, GaN, InGaN, AlInGaN or the combination thereof. In the present embodiment, the material of the LT nucleation layer 2011 and HT nucleation layer 2012 both are AlN.

In one embodiment, the thickness of the LT nucleation layer 2011 is 10-100 nm. In the present embodiment, the thickness of the LT nucleation layer 2011 is 40 nm.

In one embodiment, the HT nucleation layer 2012 is 100 nm-200 nm. In the present embodiment, the HT nucleation layer 2012 is 150 nm.

In one embodiment, the strain structure 2021 of the buffer structure 202 includes a pair or pairs of two strain layers (not shown). The material of the two strain layers includes AlN/AlGaN or AlGaN/AlGaN. In one embodiment, each pair of the strain structure 2021 includes the same or different material with different doping conditions, such as a pair of undoped material and doped material. The undoped material/doped material can be undoped AlGaN/doped AlGaN, undoped AlN/doped AlN, undoped AlN/doped AlGaN, or undoped AlGaN/doped AlN. In the present embodiment, the undoped material/doped material is carbon-doped AlN/undoped AlGaN. In one embodiment, the strain structure 2021 comprises a superlattice structure of $Al_mGa_{1-m}N$ and $Al_nGa_{1-n}N$, wherein $0 \leq m \leq 1$, $0 \leq n \leq 1$.

In one embodiment, the strain structure 2021 includes 50 to 100 pairs. In the present embodiment, the strain structure 2021 includes 80 pairs. In one embodiment, the strain structure 2021 includes 80 pairs. In one embodiment, a thickness of each strain layer is 5 nm to 30 nm.

In one embodiment, the high resistance thick layer 2022 includes GaN or AlGaN doped with carbon (C) or iron (Fe). And a thickness of the high resistance thick layer 2022 is 1 µm to 5 µm. In the present embodiment, a thickness of the high resistance thick layer 2022 is more than or equal to 2 um.

In one embodiment, a doping concentration of carbon (C) or iron (Fe) in the high resistance thick layer 2022 is at least $10^{18}$ cm$^{-3}$.

In one embodiment, the buffer structure 202 here refers to a structure sandwiched between two materials to accommodate difference in their crystallographic structures.

In one embodiment, the high resistance thick layer 2022 here is designed for blocking leakage current passing through the current leakage path in the buffer structure 202 and the substrate 200.

In one embodiment, a material of the space layer (functional layer) 2031 includes $Al_{x3}Ga_{1-x3}N$, $0 \leq x3 \leq 1$. In the present embodiment, the Al composition ratio x3=0, which means that the space layer 2031 is a GaN layer. And a thickness of the space layer 2031 is 200 to 1000 nm.

In one embodiment, the space layer 2031 includes doped or undoped material. In the present embodiment, the space layer 2031 includes undoped material. Therefore, the space layer 2031, including a relatively thick and/or undoped layer inserted between the buffer structure 202 and the channel layer 204, is able to reduce the electron been trapped in the buffer structure 202 to reduce the effect of current collapse.

In one embodiment, a material of the back-barrier layer 2033 includes $Al_{x4}Ga_{1-x4}N$, $0 \leq x4 \leq 1$. In the present embodiment, the Al composition ratio x4 is equal to or greater than 0.5. A thickness of the back-barrier layer 2033 is 5 nm to 50 nm. In the present embodiment, a thickness of the back-barrier layer 2033 is equal to or less than 20 nm.

In one embodiment, a doping concentration of the high resistance interlayer 2032 is at least $10^{18}$ cm$^{-3}$ in order to achieve a high resistance.

In the present embodiment, a material of the high resistance interlayer 2032 includes a material with a dopant, such as C dopant or a Fe dopant. The high resistance interlayer 2032 is designed for preventing the effect of current leakage. In addition, the dopant is not limited to C or Fe. Any dopant or material that reaches high resistance can be chosen according to different design choice.

In one embodiment, a thickness of the high resistance interlayer 2032 is less than or equal to 100 nm, and a material of the high resistance interlayer 2032 includes semiconductor material such as GaN, AlGaN, InGaN, or AlInGaN. In the present embodiment, the high resistance interlayer 2032 includes a carbon-doped GaN layer with 60 nm thickness.

Furthermore, the channel layer 204 is formed on the back-barrier structure 203, and the barrier layer 205 is formed on the channel layer 204. A 2DEG 29 is formed in the channel layer 204 near an interface of the channel layer 204 and the barrier layer 205 due to the spontaneous polarization and piezoelectric polarization thereof.

In one embodiment, a material of the channel layer 204 includes semiconductor material such as GaN, AlGaN, AlInGaN, InGaN or the combination thereof. In one embodiment, a material of the barrier layer 205 includes semiconductor material such as GaN, AlGaN, AlInGaN, InGaN or the combination thereof. In the present embodiment, the material of the channel layer 204 includes GaN, and the material of the barrier layer 205 includes $Al_yGa_{1-y}N$, $0 < y \leq 1$.

In one embodiment, the thickness of the channel layer 204 is 100 nm to 300 nm, and a thickness of the barrier layer 205 is 10 nm to 50 nm. In the present embodiment, the thickness of the back-barrier layer 205 is equal to or less than 20 nm.

In the present embodiment, the cap layer 206 is formed on the barrier layer 205. A material of the cap layer 206 is GaN, and a thickness of the cap layer 206 is 2 nm to 50 nm. In the present embodiment, a thickness of the cap layer 206 is less than or equal to 10 nm.

In one embodiment, the source electrode 207 and/or the drain electrode 209 can be formed directly on the cap layer 206, the barrier layer 205, the channel layer 204, the back-barrier structure 203, or the buffer structure 202.

In another embodiment of a recess E-mode power device (not shown), the gate electrode 208 can be formed in a recess (not shown) through the cap layer 206, and the barrier layer 205, exposing a portion of the channel layer 204.

In another embodiment of a p-GaN E-mode power device (not shown), the gate electrode 208 can be formed on a p-GaN layer (not shown) which is formed above the cap layer 206 or the barrier layer 205.

Figure 6A:
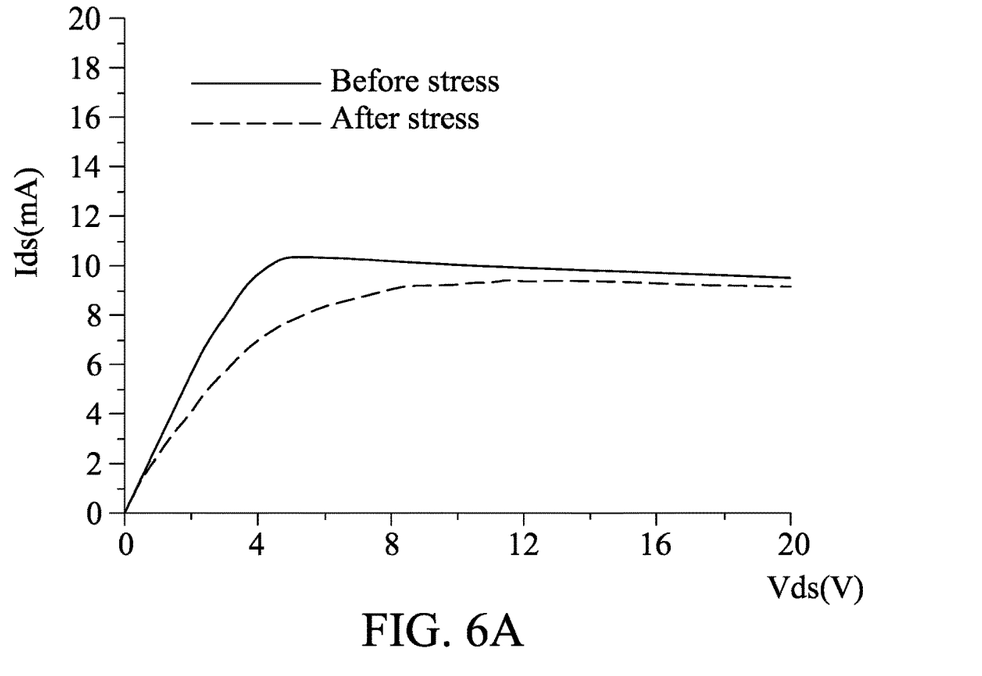
FIGS. 6A-6C show a comparison of $I_d$-$V_{ds}$ characteristics diagrams between the semiconductor power device 10, the semiconductor power device 1000 in accordance with the first embodiment of the present disclosure, and the semiconductor power device 2000 in accordance with the second embodiment of the present disclosure.

FIG. 6A shows the $I_{ds}$-$V_{ds}$ characteristics diagram of the semiconductor power device 10 of the present disclosure. In FIG. 6A, the solid line refers to the $I_{ds}$-$V_{ds}$ characteristic of the semiconductor power device 10 operated before the off-state stressing condition and the dotted line refers to the $I_{ds}$-$V_{ds}$ characteristic of the semiconductor power device 10 operated after the off-state stressing condition. Based on the aforementioned method, the effect of current collapse can be evaluated. In FIG. 6A, the reciprocals of slope of a linear regression curve (not shown) of the linear segments before and after the off-state stressing condition can represent a turn-on resistance $R_{ON1}$ before the off-state stressing condition operation and a turn-on resistance $R_{ON2}$ after the off-state stressing condition operation, respectively.

Figure 6B:
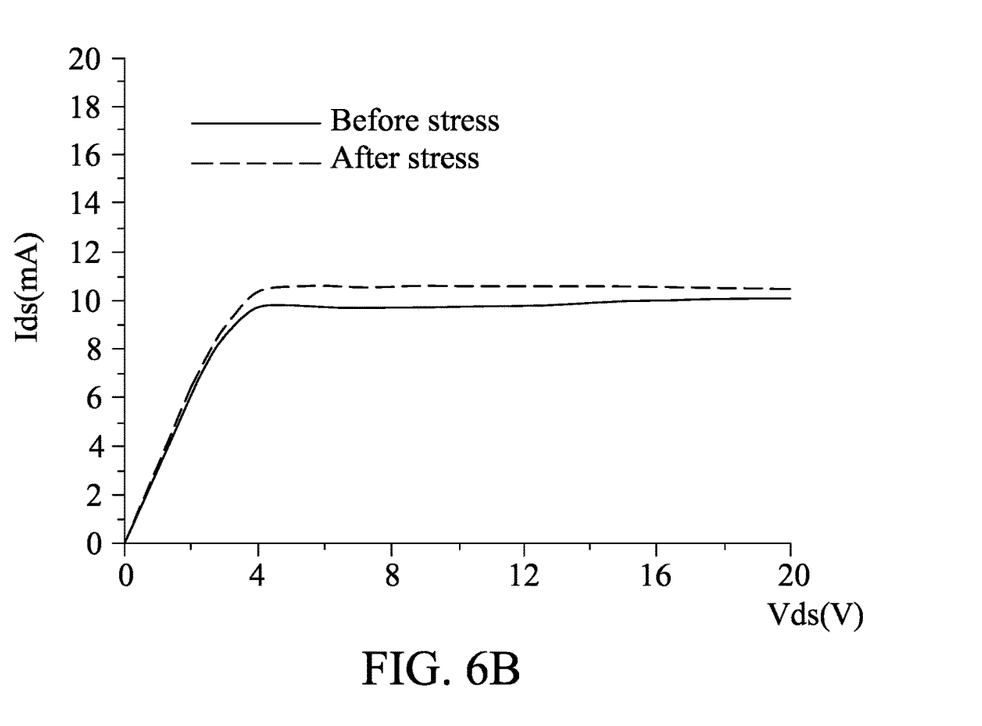

FIG. 6B shows the $I_{ds}$-$V_{ds}$ characteristics diagram of the semiconductor power device 1000 of the present disclosure. In FIG. 6B, the solid line refers to the $I_{ds}$-$V_{ds}$ characteristic of the semiconductor power device 1000 operated before the off-state stressing condition and the dotted line refers to the $I_{ds}$-$V_{ds}$ characteristic of the semiconductor power device 1000 operated after the off-state stressing condition. Based on the aforementioned method, the effect of current collapse can be evaluated. In FIG. 6B, the reciprocals of slope of a linear regression curve (not shown) of the linear segments before and after the off-state stressing condition can represent a turn-on resistance $R_{ON1}$ before the off-state stressing condition operation and a turn-on resistance $R_{ON2}$ after the off-state stressing condition operation, respectively.

Figure 6C:
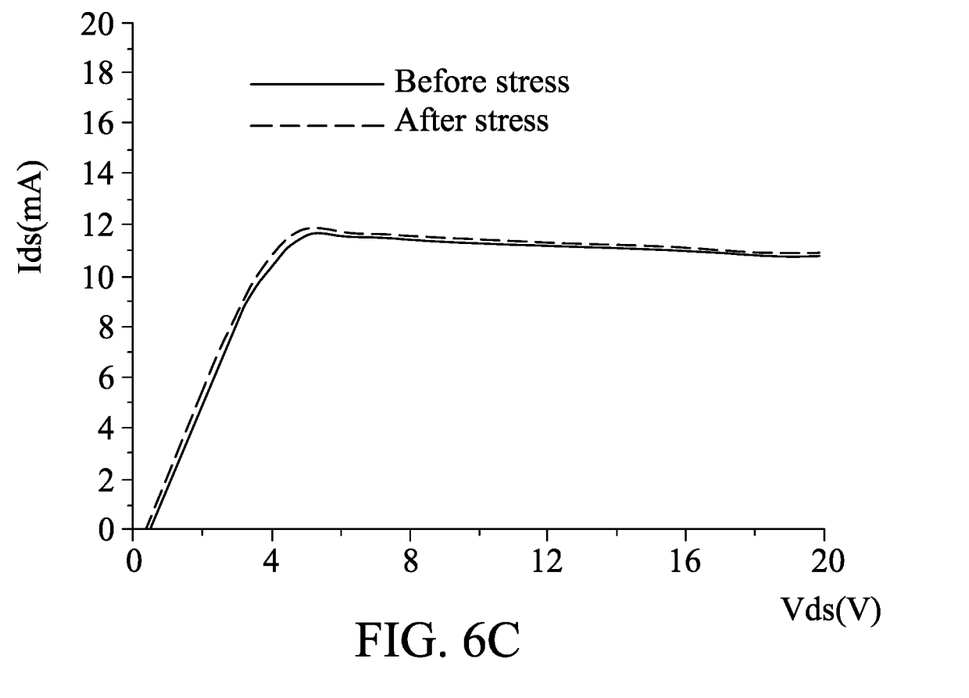

FIG. 6C shows the $I_{ds}$-$V_{ds}$ characteristics diagram of the semiconductor power device 2000 of the present disclosure. In FIG. 6C, the solid line refers to the $I_{ds}$-$V_{ds}$ characteristic of the semiconductor power device 2000 operated before the off-state stressing condition and the dotted line refers to the $I_{ds}$-$V_{ds}$ characteristic of the semiconductor power device 2000 operated after the off-state stressing condition. Based on the aforementioned method, the effect of current collapse can be evaluated. In FIG. 6C, the reciprocals of slope of a linear regression curve (not shown) of the linear segments before and after the off-state stressing condition can represent a turn-on resistance $R_{ON1}$ before the off-state stressing condition operation and a turn-on resistance $R_{ON2}$ after the off-state stressing condition operation, respectively.

After calculation, the ratio $R_{ON2}/R_{ON1}$ of the semiconductor power device 10 shown in FIG. 6A is 1.14, the ratio $R_{ON2}/R_{ON1}$ of the semiconductor power device 1000 shown in FIG. 6B is around one, and the ratio $R_{ON2}/R_{ON1}$ of the semiconductor power device 2000 shown in FIG. 6C is also around one. According to the results, we can conclude the effect of current collapse is reduced due to the structures of the semiconductor power device 1000 and the semiconductor power device 2000 in accordance with the first embodiment and the second embodiment respectively.

Figure 7:
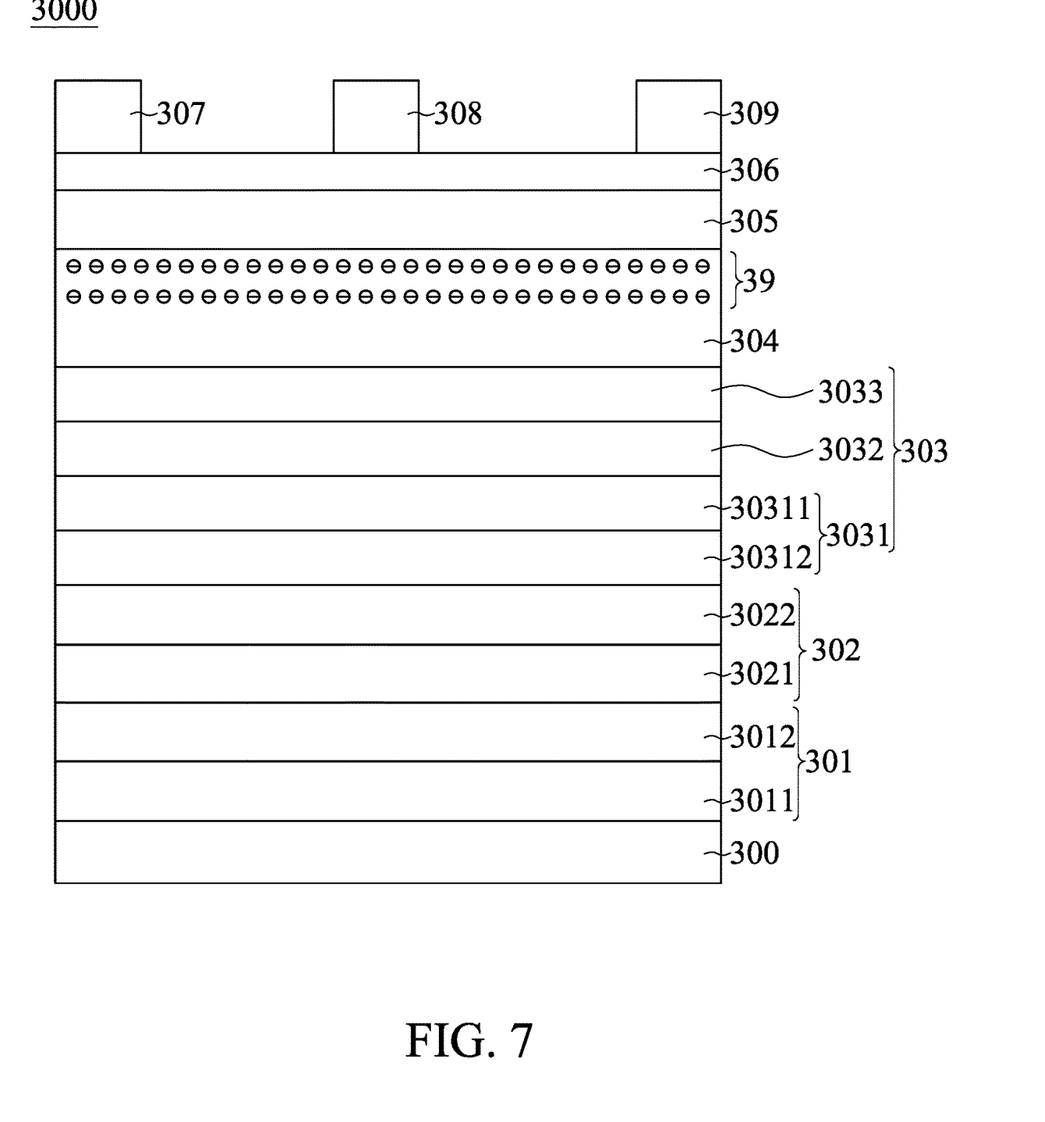
FIG. 7 shows a cross sectional view of a semiconductor power device 3000 in accordance with a third embodiment of the present disclosure.

FIG. 7 shows a cross sectional view of a semiconductor power device 3000 in accordance with a third embodiment of the present disclosure. As shown in FIG. 7, the semiconductor power device 3000 includes a substrate 300, a nucleation structure 301 formed on the substrate 300, a buffer structure 302 formed on the nucleation structure 301, a back-barrier structure 303 formed on the buffer structure 302, a channel layer 304 formed on the back-barrier structure 303, a barrier layer 305 formed on the channel layer 304, a cap layer 306 formed on the barrier layer 305, and a source electrode 307, a gate electrode 308, and a drain electrode 309 formed on the cap layer 306 respectively.

In one embodiment, the nucleation structure 301 includes one or multiple layers. In the present embodiment, the nucleation structure 301 includes a low temperature (LT) nucleation layer 3011, and a high temperature (HT) nucleation layer 3012 formed on the LT nucleation layer 3011. In one embodiment, the nucleation structure 301 is a structure for reducing the growth stress of the following layers formed on the substrate.

In the present embodiment, the low temperature is about 950~1000° C., and the high temperature is about 1010~1500° C.

In one embodiment, the buffer structure 302 includes one or multiple layers. In the present embodiment, the buffer structure 302 includes a strain structure 3021 and a high resistance thick layer 3022 formed on the strain structure 3021.

In one embodiment, the back-barrier structure 303 includes a functional structure 3031 formed on the buffer structure 302, a high resistance interlayer 3032 formed on the functional structure 3031, and a first back-barrier layer 3033 formed on the high resistance interlayer 3032. In the present embodiment, the functional structure 3031 includes a second back-barrier layer 3031 for reducing the effect of current collapse.

In one embodiment, a material of the substrate 300 includes conductive material or insulating material. The conductive material includes Si, SiC, GaN, or GaAs. The insulating material includes sapphire, or silicon on insulator (SOI). In the present embodiment, the substrate 300 includes Si.

In one embodiment, a method of forming the nucleation structure 301, the buffer structure 302, the back-barrier structure 303, the channel layer 304, the barrier layer 305, or the cap layer 306 includes physical vapor deposition (PVD), atomic layer deposition (ALD), metal-organic chemical vapor deposition (MOCVD), or molecular-beam epitaxy (MBE). In the present embodiment, the method of growing the LT nucleation layer 3011 and/or the HT nucleation layer 3012 is MOCVD. In the present embodiment, the method of growing the nucleation structure 301, the buffer structure 302, the back-barrier structure 303, the channel layer 304, the barrier layer 305, and the cap layer 306 is MOCVD.

In one embodiment, a material of the LT nucleation layer 3011 and the HT nucleation layer 3012 includes semiconductor material such as AlN, AlGaN, GaN, InGaN, AlInGaN or the combination thereof. In the present embodiment, the material of the LT nucleation layer 3011 and HT nucleation layer 3012 both are AlN.

In one embodiment, the strain structure 3021 of the buffer structure 302 includes a pair or pairs of two strain layers (not shown). The material of the two strain layers includes AlN/AlGaN or AlGaN/AlGaN. In one embodiment, each pair of the strain structure 3021 includes the same or different material with different doping conditions, such as a pair of undoped material and doped material. The undoped material/doped material can be undoped AlGaN/doped AlGaN, undoped AlN/doped AlN, undoped AlN/doped AlGaN, or undoped AlGaN/doped AlN. In the present embodiment, the undoped material/doped material is carbon-doped AlN/undoped AlGaN.

In one embodiment, the strain structure 3021 comprises a superlattice structure includes 50 to 100 pairs. In the present embodiment, the strain structure 3021 includes 80 pairs. In one embodiment, a thickness of each strain layers is 5 nm to 30 nm. In one embodiment, the strain structure 3021 comprises a superlattice structure of $Al_mGa_{1-m}N$ and $Al_nGa_{1-n}N$, wherein $0 \leq m \leq 1$, $0 \leq n \leq 1$.

In one embodiment, the high resistance thick layer 3022 includes GaN or AlGaN doped with carbon (C) or iron (Fe). In one embodiment, a doping concentration of carbon (C) or iron (Fe) in the high resistance thick layer 3022 is at least $10^{18}$ cm$^{-3}$.

In one embodiment, a thickness of the high resistance thick layer 3022 is 1 μm to 5 μm. In the present embodiment, a thickness of the high resistance thick layer 3022 is more than or equal to 2 um.

In one embodiment, the buffer structure 302 here refers to a structure sandwiched between two materials to accommodate difference in their crystallographic structures, the high resistance thick layer 3022 is designed for blocking the leakage current passing through the current leakage path in the buffer structure 302 and the substrate 300.

In the present embodiment, the functional structure 3031 includes a first functional layer 30311 and a second functional layer 30312 formed between the first functional layer 30311 and the buffer structure 302. In the embodiment, the first functional layer 30311 includes a second back-barrier layer. The second functional layer 30312 includes a space layer.

In one embodiment, a material of the space layer (second functional layer) 30312 includes $Al_{x5}Ga_{1-x5}N$, $0 \leq x5 \leq 1$. In the present embodiment, the Al composition ratio x5=0, which means that the space layer 30312 is a GaN layer. A thickness of the space layer 30312 is 200 to 1000 nm.

In one embodiment, the space layer 30312 includes undoped or doped material.

In one embodiment, a material of the second back-barrier layer (first functional layer) 30311 includes $Al_{x6}Ga_{1-x6}N$, $0 \leq x6 \leq 1$. In the present embodiment, the Al composition ratio x6 is equal to or greater than 0.5. A thickness of the second back-barrier layer 30311 is 5 to 50 nm. Therefore, the space layer 30312, including a relatively thick and undoped layer, and the second back-barrier layer 30311, including a high band-gap and thin thickness layer inserted between the buffer structure 302 and the channel layer 304, are able to reduce the electron been trapped in the buffer structure 302 to reduce the effect of current collapse.

In one embodiment, a material of the first back-barrier layer 3033 includes $Al_{x7}Ga_{1-x7}N$, $0 \leq x7 \leq 1$. In the present embodiment, the ratio composition x7 is equal to or greater than 0.5. A thickness of the first back-barrier layer 3033 is 5 nm to 50 nm. In the present embodiment, a thickness of the first back-barrier layer 3033 is equal to or less than 20 nm and the first back-barrier layer 3033 is undoped.

In the present embodiment, the Al composition ratio x6 is equal to or higher than the Al composition ratio x7. Therefore, the band-gap of the second back-barrier layer 30311 is equal to or higher than the first back-barrier layer 3033 in order to further reduce the effect of current collapse.

In the present embodiment, a material of the high resistance interlayer 3032 includes a material with a dopant, such as C or Fe dopant. In one embodiment, a doping concentration of the C dopant or the Fe dopant in the high resistance interlayer 3032 is at least $10^{18}$ cm$^{-3}$ in order to achieve a high resistance. Due to the high resistance of the high resistance interlayer 3032, the electrons can be prevented from passing through it and the effect of current leakage can also be reduced. The dopant is not limited to C or Fe. Any dopant or material that reaches a high resistance material of the high resistance interlayer 3032 can be chosen according to different design choice.

In one embodiment, a thickness of the high resistance interlayer 3032 is less than or equal to 100 nm, and a material of the high resistance interlayer 3032 includes semiconductor material such as GaN, AlGaN, InGaN, or AlInGaN.

In one embodiment, the channel layer 304 is formed on the back-barrier structure 303, and the barrier layer 305 is formed on the channel layer 304. A 2DEG 39 is formed in the channel layer 304 near an interface of the channel layer 304 and the barrier layer 305 due to the spontaneous polarization and piezoelectric polarization.

In the present embodiment, a material of the channel layer 304 includes GaN, and the material of the barrier layer 305 includes $Al_yGa_{1-y}N$, $0 < y \leq 1$. A thickness of the channel layer 304 is 100 nm to 300 nm, and a thickness of the barrier layer 305 is 10 nm to 50 nm.

In the present embodiment, the cap layer 306 is formed on the barrier layer 305. In one embodiment, a material of the cap layer 306 is GaN, and a thickness of the cap layer 306 is 2 nm to 50 nm. In the present embodiment, a thickness of the cap layer 306 is less than or equal to 10 nm.

The location and the structure of the source electrode 307, the gate electrode 308, and the drain electrode 309 on the semiconductor power device 3000 can be adjusted according to different designs of the semiconductor power device 3000 such as a D-mode power device or an E-mode power device.

In the present embodiment, the source electrode 307, the gate electrode 308, and the drain electrode 309 are formed on the cap layer 306.

In one embodiment, the source electrode 307 and/or the drain electrode 309 can be formed directly on the cap layer 306, the barrier layer 305, the channel layer 304, the back-barrier structure 303 or the buffer structure 302.

In another embodiment of a recess E-mode power device (not shown), the gate electrode 308 can be formed in a recess (not shown) through the cap layer 306, and the barrier layer 305, and exposing a portion of the channel layer 304.

In another embodiment of a p-GaN E-mode power device (not shown), the gate electrode 308 can be formed on a p-GaN layer (not shown) which formed is above the cap layer 306 or the barrier layer 305.

It is believed that the present embodiments and their advantages will be understood from the foregoing description, and it will be apparent that various changes may be made thereto without departing from the spirit and scope of the embodiments or sacrificing all of its material advantages.

What is claimed is:
1. A semiconductor power device, comprising:
a substrate;
a buffer structure formed on the substrate;
a barrier structure formed on the buffer structure;
a channel layer formed on the barrier structure; and
a barrier layer formed on the channel layer;
wherein the barrier structure comprises a first functional layer on the buffer structure, a first back-barrier layer on the first functional layer, and an interlayer between the first back-barrier layer and the first functional layer;

wherein a material of the first back-barrier layer comprises $Al_{x1}Ga_{1-X1}N$, a material of the first functional layer comprises $Al_{x2}Ga_{1-X2}N$, a material of the interlayer comprises $Al_{x3}Ga_{1-x3}N$, doped with carbon or iron, wherein 0<x1≤1, 0<x2≤1, x3≥0, and x3<x1<x2; wherein a thickness of the interlayer is greater than a thickness of the first back-barrier layer and greater than a thickness of the first functional layer.

2. The semiconductor power device as claimed in claim 1, wherein 0.5≤x2.

3. The semiconductor power device as claimed in claim 2, wherein 0.5≤X1.

4. The semiconductor power device as claimed in claim 2, wherein the thickness of the first back-barrier layer is less than or equal to 20 nm, and/or the thickness of the first functional layer is less than or equal to 20 nm.

5. The semiconductor power device as claimed in claim 4, further comprises a second functional layer formed between the first functional layer and the buffer structure, wherein a material of the second functional layer comprises undoped $Al_{x3}Ga_{1-x3}N$, wherein 0≤x3≤1; and wherein a thickness of the second functional layer is 200-1000 nm.

6. The semiconductor power device as claimed in claim 2, wherein the first back-barrier layer and/or the first functional layer is undoped.

7. The semiconductor power device as claimed in claim 1, wherein a two dimensional electron gas is formed near an interface of the channel layer and the barrier layer.

8. The semiconductor power device as claimed in claim 1, wherein a thickness of the interlayer is less than or equal to 100 nm, and a material of the interlayer comprises GaN.

9. The semiconductor power device as claimed in claim 1, further comprising a nucleation structure formed between the substrate and the buffer structure.

10. The semiconductor power device as claimed in claim 9, wherein a material of the nucleation structure comprises AlN.

11. The semiconductor power device as claimed in claim 1, wherein the buffer structure comprises a strain structure, and the strain structure comprises a superlattice structure of $Al_mGa_{1-m}N$ and $Al_nGa_{1-n}N$, wherein 0≤m≤1, 0≤n≤1.

12. The semiconductor power device as claimed in claim 1, wherein the buffer structure comprises a thick layer, a thickness of the thick layer is more than or equal to 2 um, and a material of the thick layer comprises a C-doped or a Fe-doped GaN.

13. The semiconductor power device as claimed in claim 1, wherein a material of the barrier layer comprises $Al_kGa_{1-k}N$, wherein 0<k≤1, and a material of the channel layer comprises GaN.

14. The semiconductor power device as claimed in claim 1, further comprises a first electrode formed on the barrier layer, and a second electrode formed on the barrier layer.

15. The semiconductor power device as claimed in claim 14, further comprises a third electrode formed on the barrier layer.

16. The semiconductor power device as claimed in claim 15, further comprising a cap layer formed between the barrier layer and the first electrode, the barrier layer and the second electrode, and/or the barrier layer and the third electrode.

17. The semiconductor power device as claimed in claim 16, wherein a material of the cap layer comprises GaN, and a thickness of the cap layer is less than or equal to 10 nm.

18. The semiconductor power device as claimed in claim 1, wherein 0.5<x2, and a material of the interlayer comprises GaN doped with carbon or iron.

19. The semiconductor power device as claimed in claim 18, wherein the buffer structure comprises a thick layer and a strain structure, and the strain structure comprises a superlattice structure of $Al_mGa_{1-m}N$ and $Al_nGa_{1-n}N$.

* * * * *